United States Patent [19]

Layton et al.

[11] 4,165,536

[45] Aug. 21, 1979

[54] MAGNETIC BUBBLE PACKAGE

[75] Inventors: Wilbur T. Layton, San Diego; Sidney J. Schwartz, Vista, both of Calif.

[73] Assignee: Burroughs Corporation, Detroit, Mich.

[21] Appl. No.: 933,054

[22] Filed: Aug. 11, 1978

[51] Int. Cl.[2] .............................................. G11C 19/08
[52] U.S. Cl. ................................................................ 365/2
[58] Field of Search ............................................... 365/2

[56] References Cited

U.S. PATENT DOCUMENTS

| | | | |
|---|---|---|---|
| 4,027,298 | 5/1977 | Michaelis | 365/2 |
| 4,096,581 | 6/1978 | Carlo et al. | 365/2 |
| 4,101,970 | 7/1978 | Saito et al. | 365/2 |

Primary Examiner—James W. Moffitt

Attorney, Agent, or Firm—Joseph R. Dwyer; Mervyn L. Young; Kevin R. Peterson

[57] ABSTRACT

A package having bubble memory components comprising an innerassembly of bubble memory chips surrounded by spaced orthogonally oriented drive coils, a printed circuit board having a rigid support portion for the chips and a flexible portion containing conductors for direct interchip communication and for direct connection to the outside world, means in the form of tapers of controlled thermally conductive material for assisting in controlling the temperatures of the bias magnets and for providing a magnetic gradient for bubble propagation, thermal compliant members, and flexible heat conductors which together with the tapers, manage the heat within the package.

12 Claims, 7 Drawing Figures

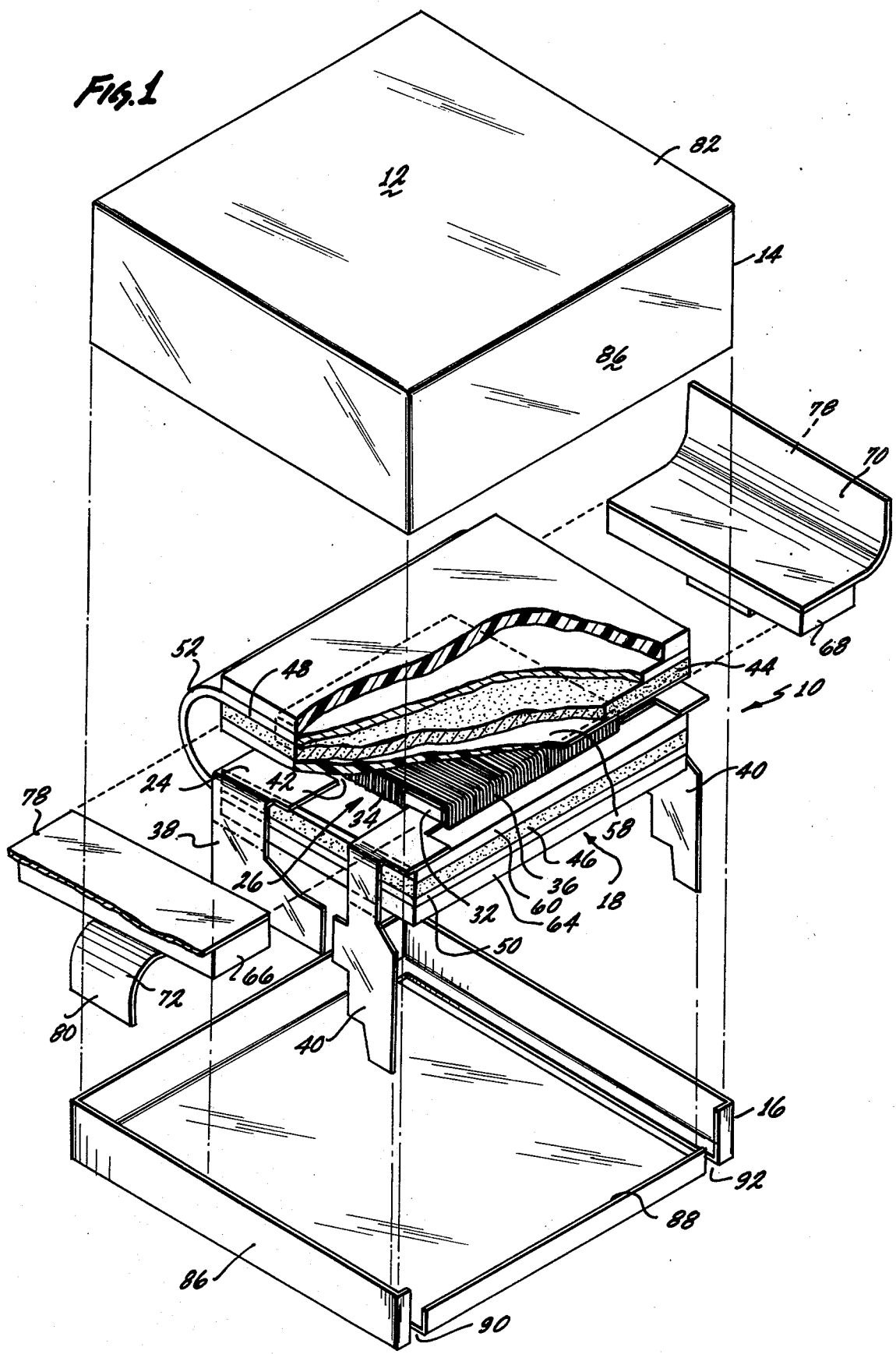

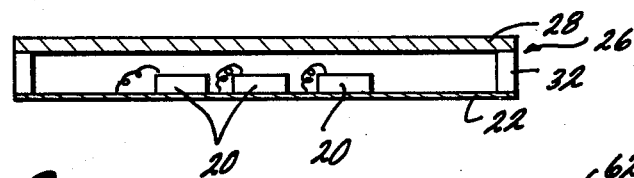
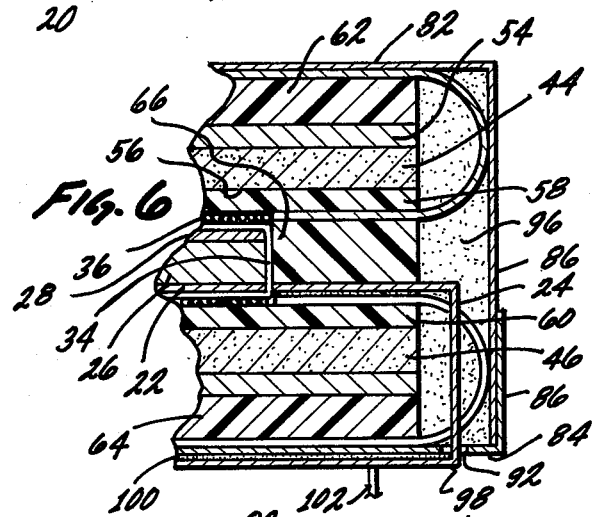
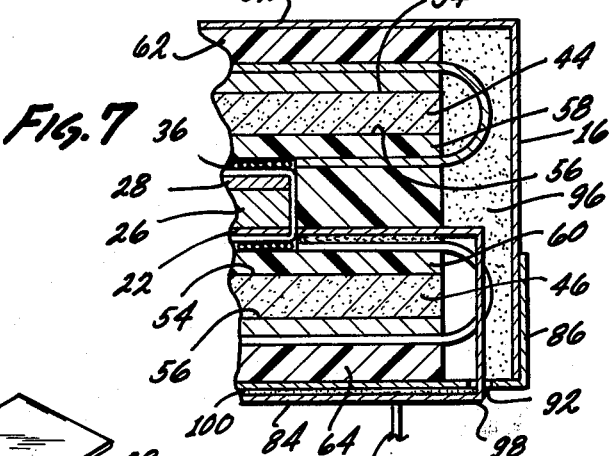
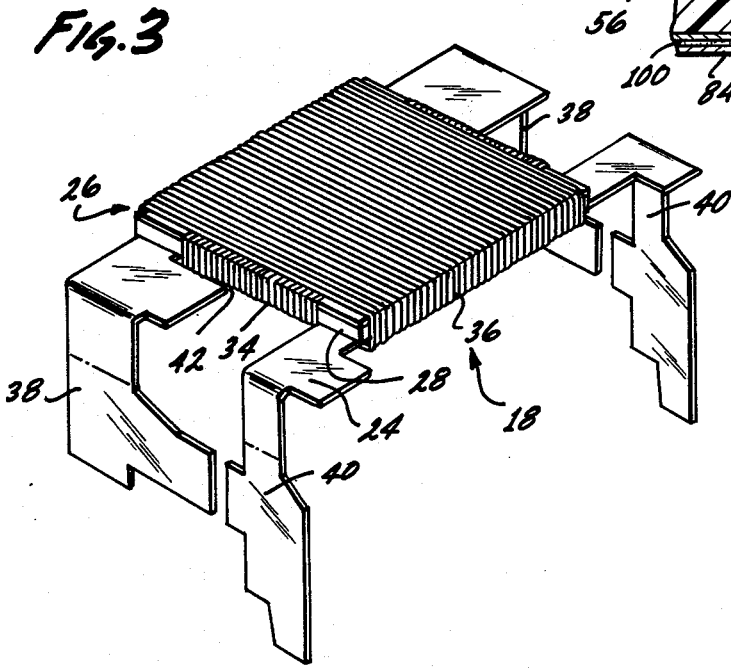

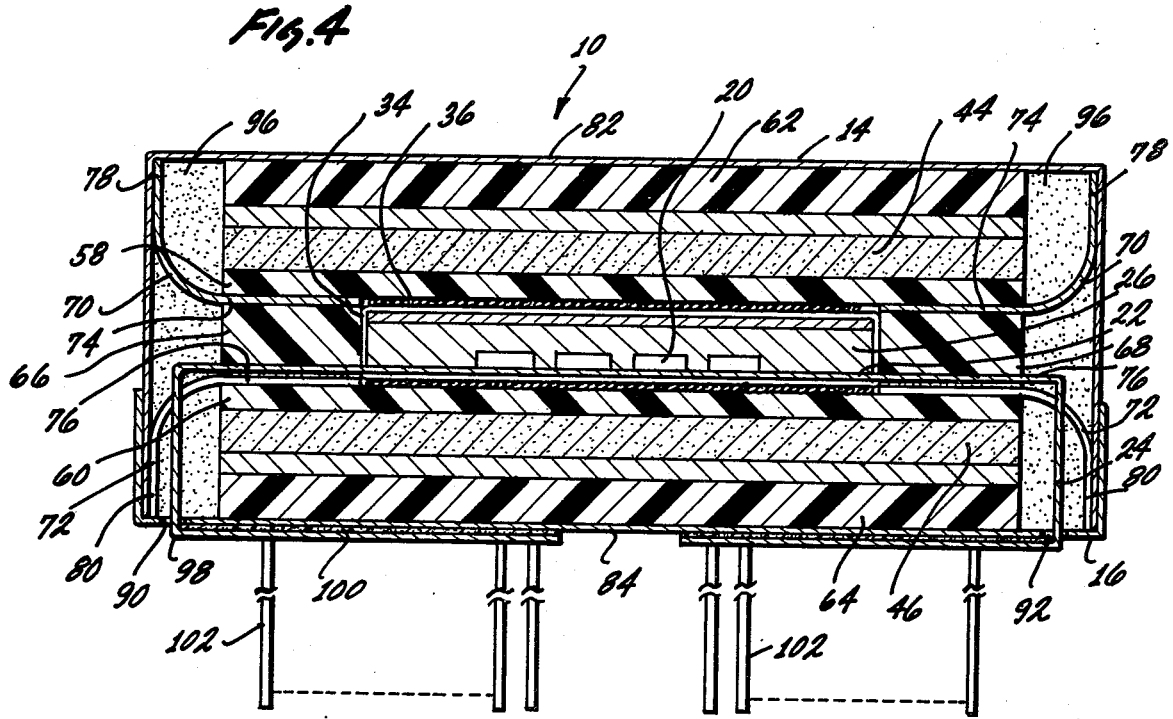
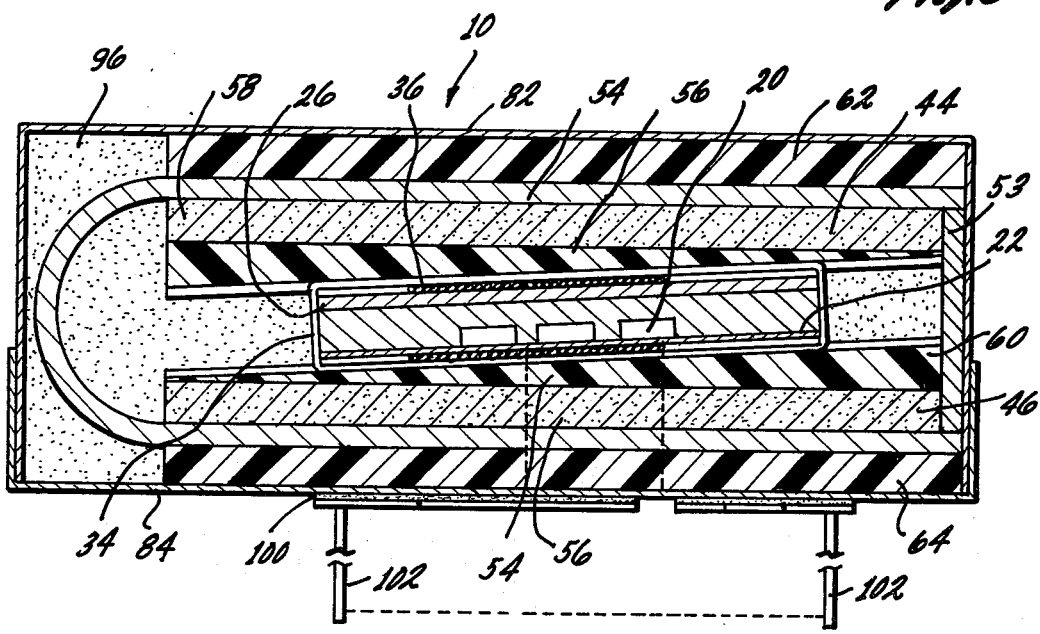

MAGNETIC BUBBLE PACKAGE

CROSS REFERENCE TO RELATED APPLICATIONS

U.S. Pat. Application of W. T. Layton, Ser. No. 933,055 entitled "THERMAL CONTROL MEMBER, BUBBLE MEMORY", filed Aug. 11, 1978.

U.S. Pat. Application of W. T. Layton, Ser. No. 933,053 entitled "THERMAL CONDUCTOR, BUBBLE MEMORY" filed Aug. 11, 1978.

BACKGROUND OF THE INVENTION

This invention relates to magnetic bubble (domain) assemblies and more particularly to a new and improved bubble memory package arrangement.

A magnetic bubble package comprises one or more chips or modules containing a thin layer of garnet-like material formed on a substrate and disposed between the bias magnets to provide a bias field normal to the plane of the substrate to establish and maintain bubbles in the garnet-like material. For bubble movement (propagation) in the plane of garnet-like material sinusoidal type field drive coils, provide rotational in-plane magnetic fields and surround the substrate. Means are also provided to interconnect the chips to one another, if there is more than one chip in the package, to the control circuitry for performing various bubble manipulations in the chips and to connect the memory to the outside world.

In the prior art, this latter means for connecting the chip to other chips and to the outside world comprised a rigid printed circuit board on which the chips were mounted and the latter was connected by wires or other suitable conductors to pins or other connectors. This required an interconnection between the chips and the printed circuit board and another connection between the printed circuit board and the pins—all of which introduce possible malfunctions (open or cold solder joints) and increased the overall thickness of the package.

Accordingly, it is one of the objects of this invention to provide a new and improved means to interconnect the chips to one another and to the control circuitry in a bubble memory package device which illuminates a number of interconnections and is slimmer than the prior art systems.

Too, conventionally, in order to provide a magnetic gradient or differential between the bias magnets and the chips to insure proper bubble manipulation and propagation, it was common practice to taper the bias magnets themselves on one side, i.e., to form an incline on one side of the bias magnets facing the chips, to provide a magnetic differential gradient in one direction. A typical example of this prior art is shown in the U.S. Pat. No. 4,027,298. However, one of the defects in this was the difficulty in placing the taper on the surface of the magnets because of the necessary grinding and honing of the magnetic material. This was expensive and increased the cost of the package. Too, such an arrangement did not allow for any adjustments relative to the plane of the yoke or substrate and required the components to have rather rigid tolerance requirements.

Accordingly, it is still another object of this invention to provide a bubble memory package with a means of providing a magnetic gradient to the bubble chips without utilizing tapered bias magnets which heretofore have increased the cost of manufacture of the bubble assemblies and have rather rigid tolerance requirements.

In addition to the foregoing, it is well known that it is desirable to maintain the space between the assembled components i.e., coils, chips, interconnection circuitry, etc. as small as possible, for a number of reasons, including reducing the power requirements of the field drive coils. However, it is also recognized that the largest source of heat comes from the field drive coils during operation and that, unless this heat is dissipated or controlled, the operating characteristics of the magnets and the chips are materially and sometimes adversely affected. It is also well known that it is especially desirable to maintain the temperature of the bias magnets as close as possible to the temperatures of the chips so that the bias field will remain constant relative to the chips thus not disrupting the size or position of the bubbles.

The control or management of this heat and the distribution thereof throughout the bubble package is disclosed and claimed in the copending U.S. Pat. Application of W. T. Layton, entitled "THERMAL CONTROL MEMBER, BUBBLE MEMORY", supra. In this application, it is shown that compliant members of a selected material are placed on the side of the yoke opposite to the bias magnets and, depending upon the material selected, dissipate control heat generated by the drive coils. These compliant units also perform the function of compensating for any misalignment or tolerance variations in or among the components due to the resiliency of the units. Also, to further aid in the management of the heat within the package, reference is made also to the U.S. Patent Application copending herewith of Layton entitled "BUBBLE MEMORY PACKAGE WITH THERMAL CONTROL" in which thermal control units are shown to engage the sides of the drive coils and together with flexible heat conductor members complete the thermal control of the package. The place in which the ends of the flexible members are located largely depend upon the desired results. The application, supra, teaches the use and disposition of the ends of these flexible members.

In connection to this thermal management technique, it is important to point out that separate tapers, while providing a magnetic gradient and compensation for possible out of tolerance components, also are made of a material having controlled thermal conductive properties so they, too, aid in the management of the heat within the package.

Thus, this invention teaches how these thermal management means can function with other components of the package including the aforesaid tapers having controlled thermal conductivity to provide a bubble memory package which is less expensive to manufacture and yet is thermally efficient.

Accordingly, it is still another object of this invention to provide a package with means for controlling the heat generated in the package during operation and to do so in an inexpensive manner.

SUMMARY OF THE INVENTION

The package having bubble memory components which accomplishes the foregoing objects comprises an innerassembly of bubble memory chips surrounded by a cabinet which spaces orthogonally oriented drive coils, said chips being supported on a rigid portion of a printed circuit board which also has a flexible portion containing conductors for direct interchip communication and also for direct communication to the outside world. The package also has means in the form of tapers of controlled thermally conductive material to aid in controlling the temperatures of the bias magnets and for providing a magnetic gradient for bubble propagation purposes. The package further includes heat management means, in addition to the heat conductive tapers, comprising thermal compliant members and flexible heat conductors for controlling the heat within the package. The subassembly comprising said innerassembly and printed circuit board can be tested for functionality as a separate unit before further assembly into the package and the thermal compliant members aid in the assembly by compensating for tolerance variations in other components. The printed circuit board extends outside the package and includes pins to provide a pluggable magnetic package assembly.

BRIEF DESCRIPTION OF THE DRAWINGS

FIG. 1 is a perspective view, partially broken away, and exploded to show the various components of the bubble memory package and their relationship to one another.

FIG. 2 is an enlarged cross-sectional view showing the magnetic chips in the rigid portion of the printed circuit board and the field drive coils, FIG. 3 is a perspective view of the entire assembly comprising a printed circuit board and the innerassembly of chips and field drive coils.

FIG. 4 is a cross-sectional front view of the package looking in the direction of arrow A of FIG. 1, FIG. 5 is a cross-sectional side view, looking in the direction of arrow B of FIG. 1, and FIGS. 6 and 7 are cross-sectional views of portions of the package to show the flexible heat conductor means located in areas different from that of FIG. 4.

BRIEF DESCRIPTION OF THE PREFERRED EMBODIMENT

The drawings disclose, as a preferred embodiment of the invention, a package 10 of bubble memory components enclosed in a housing 12 comprising cover 14 and bottom 16. The components include an innerassembly 18 shown separately in FIG. 3, comprising one or more magnetic bubble memory chips 20 (FIGS. 2, 4, and 5) supported on a rigid portion 22 of a printed circuit board 24 forming the bottom wall of cabinet 26. The cabinet includes a top wall 28 and four side walls 32, which together with the rigid portion 22 support and space a pair of encompassing orthogonally oriented magnetic field generating drive coils 34 and 36 for propagating the bubbles within the chips. The printed circuit board 24, in addition to having the rigid portion 22 containing conductors for interchip communication, also has a flexible portion in the form of pairs of spaced apart extensions or legs 38 and 40 containing conductors for external connection to the outside world. The printed circuit board also is provided with a pair of slots (one shown at 42) adjacent to the rigid supporting portion and parallel to the edges thereof to permit the wire forming the drive coil 34, to be wound around the cabinet 26. Also, further description of the circuit board 24 will be described hereinafter, but it is well to note at this point that the subassembly comprising the innerassembly 18 and the printed circuit board 24, as a separate unit and shown separately in FIG. 3, can be tested, as such, for functionality so that any defects can be detected and the subassembly corrected or discarded before proceeding further in the assembly of the package. This is a definite cost reduction aspect of this invention.

A pair of relatively flat bias magnets 44 and 46 are fixed on legs 48 and 50 of the U-shaped yoke 52. The yoke is conventionally of a relatively thin magnetically soft material to form the magnetic circuit for the bias magnets 44 and 46. The magnetic circuit is completed by a plate 53 (shown only in FIG. 5). These bias magnets are disposed on both sides of the innerassembly 18 and as close as possible thereto for providing a suitable bias, generally normal to the plane of the substrate, for forming and maintaining the bubbles on the magnetic material with the chip 20.

As explained above, to provide the proper magnetic gradient for the propagation of bubbles on the conventional magnetic propagate elements, it is customary to form the bias magnets themselves with a taper i.e., an incline on one side thereof facing the chips. However, to provide this taper, grinding and honing of the magnetic material was required which is not cost effective in the manufacture of magnetic memories. In this invention, however, in order to achieve the desired result of providing a gradient, yet lessen the cost of manufacture, the magnetic bias magnets are formed into relatively thin parallelpipeds with parallel top and bottom walls 54 and 56 which also parallel the legs of the U-shaped yoke, when assembled, but in order to provide the suitable incline relative to the chips, a pair of separate discrete tapers 58 and 60, located between the bias magnets and the innerassembly, as more clearly shown in FIG. 5, cant the innerassembly 18 rather than the bias magnets yet provide the desired operational characteristics of tapered magnets. These tapers have additional advantages over the prior art tapered magnets in that they can be made of a controlled thermal conductive material thus controlling the flow of heat to the bias magnets from the field coils. The amount of heat conducted will depend on the composition of the material selected and reference is made to the copending application filed even date herewith, supra, entitled "THERMAL CONTROL MEMBER, BUBBLE MEMORY". In that application the material was disclosed in connection with discrete compliant members which will be discussed hereafter more fully but suffice to say here that the tapers can be formed of the same materials as disclosed therein for the compliant members. These tapers 58 and 60 also allow for the adjustment of the gradient during the assembly process thus relaxing the requirements of the yoke configuration. That is, such tapers provide for an adjustment to overcome any lack of parallelism of the yoke legs, for example.

As aforesaid, a major source of heat during the operation of the bubble memory package is that generated by the drive coils in propagating the magnetic bubbles within the chips. Heretofore, this heat has adversely influenced the bias magnets and the bubbles and, in general, has caused a malfunction of the chip.

To solve this heat problem, a pair of compliant thermal control units 62 and 64 are disposed on the yoke legs 48 and 50 on the sides opposite the bias magnets 44 and 46. These control units are relatively flat, discrete parallelpiped units formed of a resilient material containing suitable ingredients to control the thermal conductivity thereof for dissipating/controlling the heat generated by the drive coils 34 and 36 during the operation of the package. The amount of heat dissipated by the compliant units 62 and 64 depends upon the composition of the material selected, and these compliant units, being resilient, also perform the function in the package of compensating for any misaligned or tolerance variations in or among the components. Reference is made to the copending applicaton filed even date herewith entitled "THERMAL CONTROL MEMBER, BUBBLE MEMORY", supra, for more detailed information on these units. Suffice to say herein that they are compliant heat control units for controlling the heat generated in the package. Note again that the tapers 58 and 60, also of the same type of material, are located relative to the bias magnets so that between these two components, tapers and compliant members, the temperature of the bias magnets during the operation of the assembly can be managed. For clarity and easy reference the material for the units 58-64 from the aforementioned copending application is reproduced herein, infra, marked Table A.

In addition, to complete the thermal control of the package, relatively thin parallelpiped discrete members 66 and 68 are located approximately on the top surface of the printed circuit board 24 and have sides which engage the sides of the drive coils to conduct heat from these drive coils 34 and 36 toward the housing 12. Further, to complete the thermal control of the package, a pair of flexible heat conductor members 70 and 72, formed of a material, such as copper on Kapton, each have ends selectively located in an area where heat is feasibly conducted thereto, such as attached to the heat control units, as at 74 and 76, while the other ends 78 and 80 are located where the control of the heat may be of most benefit to the operation of the package. As explained in the copending application of W. T. Layton, filed even date herewith, supra, and entitled "BUBBLE MEMORY PACKAGE WITH THERMAL CONTROL", there are a number of places where the benefit of these flexible means 70 and 72 may be best accomplished depending upon the desired results. As shown in the drawings, the ends 78 and 80 of these flexible members 70 and 72 extend upwardly and downwardly, respectively, and fan out from the heat control units toward and engage the top of the cover 14 and toward bottom 16 of the housing 12. In this position, the ends act to conduct heat into the housing where it is dissipated into the ambient air. It should be noted here that flexible members 80 in this embodiment are narrower than members 78 to permit engagement with the housing without interference from the spaced apart extensions of the flexible portion of the printed circuit board. As explained, also in the last mentioned copending application, there is another use of these flexible heat conductors. This is shown in FIGS. 6 and 7. For examnple, if it is desired to make use of the generated heat to bring the bias magnets as close to the temperature of the propagate coils as soon as possible, the ends 78 and 80 are flexed and brought into alignment and disposed, as in FIG. 6, either between the thermal control units 62 and 64 and the walls of the housing where the heat is conducted to the housing and dissipated into the ambient air while at the same time some of the heat will be contained in the thermal control units, or the heat may be managed in a different manner, that is, by locating the ends 78 and 80 between the thermal control units 62 and 64 of the legs of the yoke as in FIG. 7. The conducted heat will, in this latter arrangement, have a more direct effect on the bias magnets.

Turning now more specifically to the housing 12 in which the entire assembly of components thus far described, is assembled, it can be seen that the housing 12 comprises a top cover 14 and a bottom cover 16 with relatively flat thin top and bottom walls 82 and 84 and four side walls 86, the side walls of the top cover being adapted to be received by the side walls of the bottom cover in telescoping fashion (see FIGS. 2 and 3). In addition, to aid in the assembly of the package, one of the bottom walls is shortened as at 88 (FIG. 1) and the bottom wall is also provided with elongated slots 90 and 92 paralleling two of its side walls but slightly spaced therefrom and opening in the direction of the shortened bottom wall to receive the flexible portion of the printed circuit board after having been folded as at 94 around the portion of the compliant members, yoke, etc. disposed on one side of the innerassembly. This is depicted clearly in FIG. 2. Before final assembly into the housing 12, the assembly of components are formed into a rigid unit by epoxy as depicted at 96. This is accomplished preferably by placing the assembly into a mold cavity of the size corresponding to the innerspace dimensions of the housing and filling the spaces with epoxy such as "Scotchcast" No. 250, or Emmerson Cummings "Stycast" No. 3020. Then, the epoxied unit is placed in the housing and finally flexible portions of the printed circuit board 24 are then folded as at 98 on the outside of the housing bottom wall 82, in overlapping fashion in alignment with the bottom wall of the housing and fastened to an insulator 100 in any suitable manner. Pins 102, being pressed and soldered into the flexible portion 22 of the printed circuit board 23, form a pluggable package.

TABLE A

| NAME (Density) | % LOAD By/wt.) | HARD-NESS (Shore A) | THERMAL CONDUC-TIVITY (W/in. °C. ×10 $^{-3}$) |
| --- | --- | --- | --- |
| 1. Aluminum Oxide | — | — | 17.20 |
| $Al_2O_3$ + R6103 | 40 | 64 | 1.70 |
| $Al_2O_3$ + R6103 | 60 | 69 | 1.92 |
| $Al_2O_3$ + R6103 | 80 | 71 | 2.44 |
| $Al_2O_3$ + R6103 | 100 | 78 | 3.07 |
| $Al_2O_3$ + R6103 | 150 | 84.5 | 4.08 |
| 2. Zinc Oxide | — | — | 15.10 |
| ZnO + R6103 | 25 | 65 | 1.40 |
| ZnO + R6103 | 50 | 65 | 2.78 |
| ZnO + R6103 | 75 | 72 | 3.40 |
| ZnO + R6103 | 100 | 75 | 3.85 |
| 3. Lead Oxide | — | — | |
| $Pb_3O_4$ + R6103 | 25 | 58 | 5.48 |
| $Pb_3O_4$ + R6103 | 50 | 55 | 7.54 |
| $Pb_3O_4$ + R6103 | 75 | 51 | 10.51 |
| $Pb_3O_4$ + R6103 | 100 | 48 | 12.51 |
| 4. Ferric Oxide | — | — | 14.99 |
| $Fe_2O_3$ + R6103 | 25 | 63 | 1.55 |
| $Fe_2O_3$ + R6103 | 50 | 66 | 1.67 |
| $Fe_2O_3$ + R6103 | 75 | 69 | 1.89 |
| 5. Boron Nitride | — | — | |
| BN + R6103 | 10 | 62 | 1.78 |
| BN + R6103 | 25 | 66 | 2.37 |
| BN + R6103 | 40 | 72 | 2.81 |
| BN + R6103 | 50 | 75 | 3.00 |

What is claimed is:

1. A magnetic bubble package having an assembly of bubble memory components comprising:
   bubble memory chip means,
   printed circuit board means having a flexible portion and a rigid portion, said bubble memory chip means being mounted on said rigid portion with said flexible portion extending outwardly therefrom, said printed circuit board means containing electrical conductor means for interchip communication and for communication to external devices, a plurality of drive coils for providing a magnetic field rotating in the plane of said chip means, means defining chamber means formed in part by said rigid portion of said circuit board for spacing said drive coils from said chip means, yoke means with legs spaced from but juxtaposed said coils and having parallelepiped-shaped bias magnets located with respect to said drive coils and said chip means to provide a magnetic field normal to the plane of said chip means, and discrete wedge-shaped taper means disposed between said bias magnets and said coil means for positioning chip means with respect to said bias magnets to provide a magnetic gradient on said chip means.

2. The magnetic bubble package as claimed in claim 1 wherein said taper means is made of materials selected for its thermal conductive qualities.

3. The magnetic bubble package as claimed in claim 2 further including first heat control means made of materials selected for their thermal conductive qualities, said first heat control means engaging a portion of said drive coils for transferring heat generated by said drive coils away from said coils, said first heat control means being located on said printed circuit board and having a width coextensive with width of said legs of said yoke means.

4. The magnetic bubble package as claimed in claim 3 further including second heat control means comprising relatively thin, flat flexible heat conductor means engaging said first heat control means and other components of said assembly for conducting heat away from said coils and said first heat control means.

5. The magnetic bubble package as claimed in claim 4 further including a housing made of material selected for its thermal conductive, radiation and magnetic shielding qualities and enclosing said assembly.

6. The magnetic bubble memory package as claimed in claim 5 further including third heat control means comprising discrete parallelepiped-shaped thermal control units made of a material selected for its thermal conductive and resilient qualities and located between the legs of said yoke means and said housing.

7. The magnetic bubble package as claimed in claim 5 wherein said flexible heat conductor means engages the housing for conducting heat from said drive coils to said housing.

8. A magnetic bubble package as claimed in claim 6 wherein said flexible heat conductor means are looped and folded back so that portions thereof are between said housing and said third heat control means for conducting heat from said drive coils to said housing and siad third heat control means.

9. A magnetic bubble package as claimed in claim 6 wherein said flexible heat conductor means are looped and folded back so that portions thereof are located between the legs of said yoke and said third heat control means for conducting heat from said drive coils to said yoke and said third heat control means.

10. The magnetic bubble package as claimed in claim 6 wherein said third heat control means, being flexible compensates for variations in tolerance and misalignment of parts within the assembly of components.

11. The magnetic bubble package as claimed in claim 6 wherein said housing is provided with openings at said flexible portion of said printed circuit board extends through said openings for connection of said chip means to other devices.

12. The magnetic bubble package as claimed in claim 11 wherein the portion of said printed circuit board extending outside said housing is provided with pin means to provide a plug compatable bubble package.

* * * * *